United States Patent
Yabe

(10) Patent No.: US 6,490,669 B1
(45) Date of Patent: Dec. 3, 2002

(54) MEMORY LSI WITH COMPRESSED DATA INPUTTING AND OUTPUTTING FUNCTION

(75) Inventor: Yoshikazu Yabe, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/374,992

(22) Filed: Aug. 16, 1999

(30) Foreign Application Priority Data

Aug. 19, 1998 (JP) .......................................... 10-232403

(51) Int. Cl.⁷ .............................................. G06F 12/00
(52) U.S. Cl. ...................... 711/171; 711/147; 711/154; 710/20; 710/23; 710/65
(58) Field of Search .............................. 710/20, 33, 34, 710/65, 68; 711/147, 154, 170, 171

(56) References Cited

U.S. PATENT DOCUMENTS

| | | | |
|---|---|---|---|
| 5,459,850 A | * 10/1995 | Clay et al. ..................... | 703/24 |
| 5,652,857 A | * 7/1997 | Shimoi et al. ................. | 710/68 |
| 5,696,927 A | * 12/1997 | MacDonald et al. .......... | 710/68 |
| 5,710,909 A | * 1/1998 | Brown et al. ................. | 707/205 |
| 5,864,716 A | * 1/1999 | Wishneusky ................. | 341/59 |
| 6,145,069 A | * 11/2000 | Dye ............................. | 345/501 |

FOREIGN PATENT DOCUMENTS

| | | |
|---|---|---|
| JP | 4-82082 | 3/1992 |
| JP | 4-175850 | 6/1992 |
| JP | 10-154065 | 6/1998 |
| JP | 10-301841 | 11/1998 |
| JP | 11-328008 | 11/1999 |

OTHER PUBLICATIONS

Korean Office Action, dated May 2, 2001, with English language translation of Korean Examiner's comments.
Japanese Office Action, dated Apr. 17, 2001, with English language translation of Japanese Examiner's comments.
Y. Yabe et al., "Compression/Decompression DRAM for Unified Memory System", *Technical Report of IEICE*, vol. 98, No. 67, May 21, 1998, pp. 13–18.
S. Przzybylski, "New DRAM Technologies", Second Edition, MicroDesign Resources, 1996, pp. 124–127.
T. Welch, "A Technique for High–Performance Data Compression", IEEE Computer, Jun. 1984, pp. 8–19.

* cited by examiner

Primary Examiner—Matthew Kim
Assistant Examiner—Christian P. Chace
(74) Attorney, Agent, or Firm—Whitham, Curtis & Christofferson, P.C.

(57) ABSTRACT

A memory LSI with compressed data inputting and outputting function provides reduction of data transfer amount and whereby to expand effective passband width with restricting transfer loss upon transfer of variable length compressed data. Data size detection circuit detects a size of a compressed data input from an external device on the basis of a compression information added to the compressed data and indicative of a size of data after compression. A data input and output circuit and an instruction decoder are operated for a period necessary for writing operation to write in the compressed data in a memory cell array. The data size detection circuit detects size of the compressed data held in the memory cell array on the basis of the compression information upon reading out to operate the data input and output circuit and the memory cell array for a period necessary for reading operating to read out compressed data to the external device.

11 Claims, 5 Drawing Sheets

MEMORY LSI WITH COMPRESSED DATA INPUTTING AND OUTPUTTING FUNCTION

BACKGROUND OF THE INVENTION

1. Field of the Invention

The present invention relates generally to a memory LSI with a compressed data inputting and outputting function. More particularly, the invention relates to a large capacity semiconductor memory LSI (Large Scale Integrated circuit) to be used for forming a main memory system or a graphic memory system in a computer system, such as a dynamic random access memory (DRAM).

2. Description of the Related Art

In general, in a computer system constituted of a central processing unit (CPU) and a semiconductor memory LSI, a passband width of the semiconductor LSI is required to be greater associating with improvement of performance of CPU.

Therefore, particularly in case of DRAM which has longer access period in comparison with other memory LSI, technical development has been actively performed in order to improve passband width. Here, the passband width represents a data transfer performance which is designed by a product of number of signal lines to be used in data transfer and its operation frequency.

A technology to be typically employed for improving the passband of the semiconductor memory LSI is for improving operation frequency of an external interface. Currently, as the maximum passband width of DRAM, an interface technology for DRAM has realized about 600 Mbits per second per signal line.

However, due to disturbance of signal waveform caused by offset of timing between the signal lines or inconsistency of impedance of the bus, or due to external noise, switching noise or so forth, significant difficulty should be encountered in further improvement of the operation frequency.

In this circumstance, it becomes difficult to improve the passband width by simply improving the operation frequency of the external interface as in the prior art. Therefore, there has been presented a proposal to reduce a data transfer amount by compressing data to be transferred and thus equivalently improve the passband width.

Such proposal has been seen in Steven A. Przzybylski, "New DRAM Technologies", Second Edition, MicroDesign Resources, 1996, pp 124 to 127, for example.

In this technology, as shown in FIG. 5, two storage regions of a storage region 54 for a drawing data in non-compressed condition and a storage region 53 for a drawing data in compressed condition are provided in a frame buffer 52.

These regions are consisted of an aggregate of blocks corresponding to given regions on a display, respectively. On the other hand, each block in the compressed drawing data storage region 53 is provided with a marker indicative whether the data in the block is effective or null.

Upon drawing one block, a graphic controller 51 at first makes reference to the compressed drawing data in the relevant block. If the drawing data in the relevant block in the compressed drawing data storage region is effective, the graphic controller 51 performs drawing of the block on the display using the compressed drawing data. If the drawing data in the relevant block in the compressed drawing data storage region is null, the graphic controller 51 performs drawing of the block on the display using the non-compressed drawing data in the corresponding block of the non-compressed drawing data storage region 54.

In the latter case, the graphic controller 51 compresses the read out block of the non-compressed drawing data and writes in the thus compressed drawing data in the corresponding block of the compressed drawing data storage region 53 the frame buffer. Also, the graphic controller 51 gives the marker indicative that the written compressed drawing data is effective.

Upon rewriting the drawing data by the graphic controller 51, the drawing data is written in the non-compressed drawing data storage region 54. At this time, the block in the compressed drawing data storage region 53 corresponding to the rewritten block is then marked as null. Here, it should be noted that the frame buffer is a memory region to be used to be particularly for drawing display image.

The data transfer amount required for drawing display image can be significantly reduced through the following procedure. In the foregoing technology, nothing has been mentioned particularly for compression method of the drawing data. As compression method of the data having redundancy or regularity has been discussed in Terry A. Welch, "A Technique for High-Performance Data Compression", IEEE Computer, June, 1984, pp 8–19. The method discussed may be realized either by software or hardware.

On the other hand, how much data transfer amount can be reduced by such technology is variable depending upon the compression method and/or kind of the image data. However, it is typically expected that the transfer data amount can be reduced to be one half to one tenth.

In the foregoing conventional semiconductor memory LSI, data transfer amount required for drawing display image can be significantly reduced in comparison with the case where compression is not performed, by employing the data compression technology.

This technology encounters a problem in that reduction of the data transfer amount cannot be directly reflected to improvement of the effective passband width. In general, the memory LSI is fixed a period from issuance of an instruction from a memory controller to initiation of data transfer and to finishing of data transfer. This is for restricting vacant period where data is not transferred on a data bus to be minimum and thus for gaining the effective passband width of the data bus by scheduling use periods of the data bus in a lump by the memory controller.

However, since the data length of the compressed data is not fixed length, it becomes not possible to expand the passband width. In this case, when this scheduling method is employed regarding that the compressed data has fixed length, waste vacant period may be caused on the data bus for a period corresponding to the data amount reduced by data compression. Therefore, effective passband width is not expanded.

On the other hand, another problem is encountered in that it cannot compress data transfer other than that for drawing display image on a display screen. Namely, when data is to be written in the memory LSI, data transfer amount cannot be reduced. Therefore, when display image is rewritten frequently, the foregoing technology cannot be effective means.

Furthermore, when the compressed data is null, it becomes necessary to read out the drawing data from the memory LSI and thereafter, the compressed data has to be written in the memory LSI. Namely, in a certain period, wasteful data transfer is performed for writing of the compressed data between the memory LSI and the graphic control LSI. Therefore, when rewriting of the display image is frequent, effective passband width becomes small. Therefore, the foregoing technology cannot be effective means.

SUMMARY OF THE INVENTION

Therefore, it is an object of the present invention to provide a memory LSI with a compression data input and output function which can reduce data transfer amount and can expand effective passband width by restricting transfer loss upon transfer of variable length compression data.

According to one aspect of the present invention, a memory LSI with compressed data input and output function including a memory cell array performing writing and reading of data with an external device, comprises:

input and output means for performing data transfer with the external device in compressed form of data;

detecting means for detecting a size of the compressed data on the basis of a compression information added to the compressed data and indicative of size of data after compression; and means for operating at least an internal circuit including the memory cell array and the input and output means for a period necessary for transferring the compressed data depending upon a result of detection by the detecting means.

The memory LSI with compressed data input and output function includes writing means for operating the internal circuit operates the internal circuit for a period necessary for writing operation of data in the memory cell array depending upon the size of the compressed data from the external device detected by the detecting means upon writing of data in the memory cell array and thus writes data in the memory cell array, and for writing an original data obtained by decompression of the compressed data from the external device in the memory cell array, and reading means for compressing data held in the memory cell array into the compressed data upon reading out of the compressed data to the external device, and operating the internal circuit for a period necessary for reading operation of data from the memory cell array depending upon the size of the compressed data to be read out to the external device detected by the detecting means upon reading of data from the memory cell array and whereby outputting the compressed data to the external device.

According to another aspect of the present invention, writing and reading of an original data of the compressed data is performed in and from the memory cell array.

Namely, in the present invention, data transfer is performed in the compressed form, size of the compressed data is recognized on the basis of the compression information indicative of the size of the compressed data included in the data for the compressed data of variable length, and the internal circuit is operated for a period necessary for transferring the compressed data.

Therefore, upon issuance of a subsequent instruction by the external device, without waiting completion of extra operation for data transfer, effective data transfer becomes possible, and thus effective passband width can be expanded.

On the other hand, in the present invention, expansion and modification for electrical specification of the input and output terminal are not required. Therefore, the interface technology for the conventional semiconductor memory LSI can be used as is for the input and output interface.

Furthermore, in the present invention, compression and decompression of data is performed internally, and the original data before compression is held in the memory cell array to make it possible to perform reading and writing with arbitrarily varying start position or size of data in the memory cell array. Therefore, it becomes possible to effectively transfer data required by the external device to expand effective passband width.

Accordingly, by performing data compression during data transfer of drawing data or so forth, data transfer amount can be reduced, transfer loss in transfer of variable length compressed data is restricted, and the memory LSI which can expand effective passband width can be realized.

BRIEF DESCRIPTION OF THE DRAWINGS

The present invention will be understood more fully from the detailed description given herebelow and from the accompanying drawings of the preferred embodiment of the present invention, which, however, should not be taken to be limitative to the invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessarily obscure the present invention.

Figure 1:
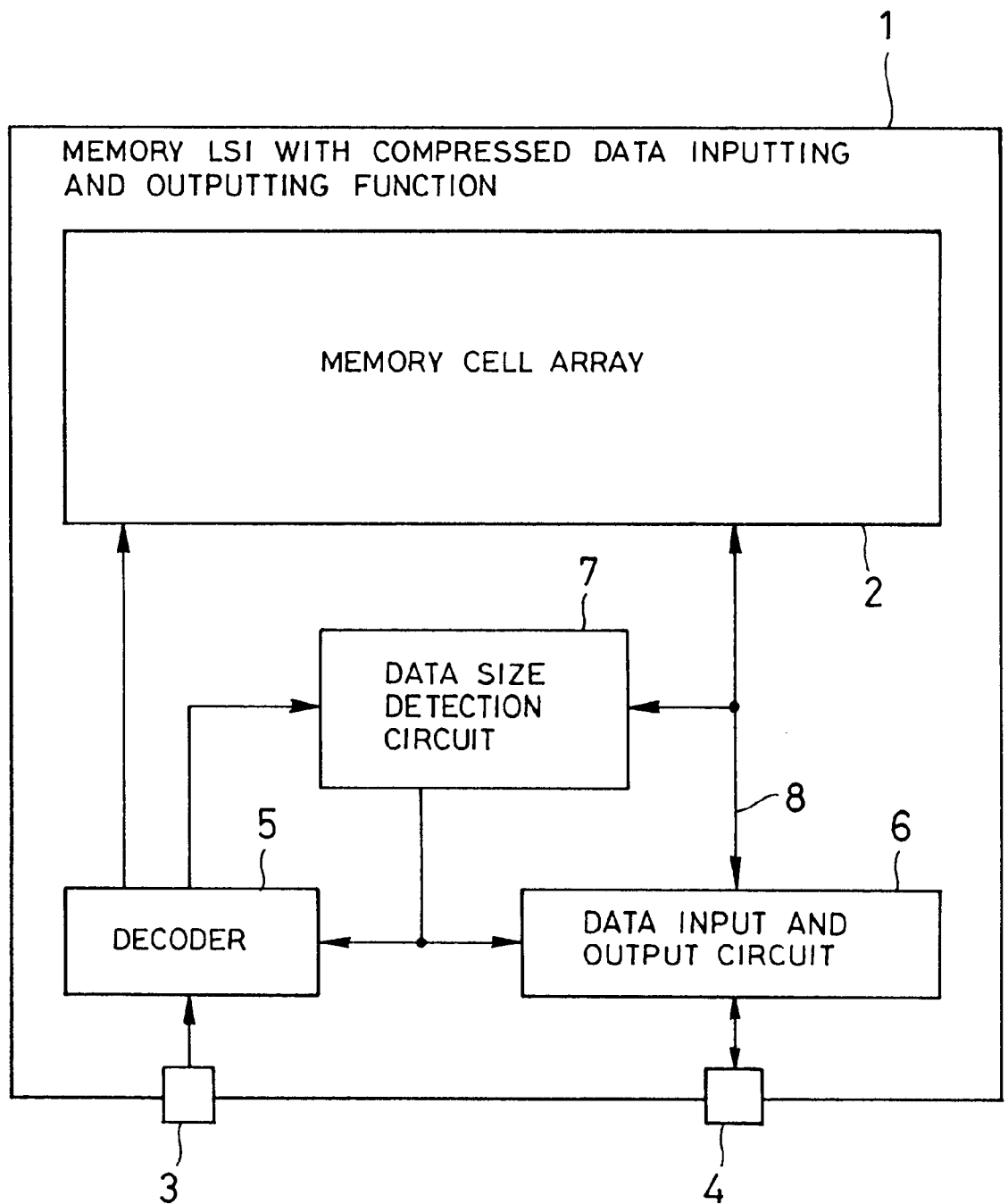
FIG. 1 is a block diagram showing a construction of one embodiment of a memory LSI with a compressed data input and output function, according to the present invention.

FIG. 1 is a block diagram showing a construction of one embodiment of a memory LSI with a compressed data input and output function, according to the present invention. In the drawing, a memory LSI with a compressed data input and output function (hereinafter referred to memory LSI) 1 is constructed with a memory cell array 2, an instruction input terminal 3, a data input and output terminal 4, an instruction decoder 5, a data input and output circuit 6 and a data size detection circuit 7.

From the instruction input terminal 3, information such as an instruction designating operation of reading out of data from the memory cell array 2, writing of data to the memory cell array 2 and so forth, an address designating storage position in the memory cell array 2 of data to be handled by the instruction, and so forth, is input.

The instruction decoder 5 receives an instruction and an address from the instruction input terminal 3 and controls the memory cell array 2, the data input and output circuit 6 and the data size detection circuit 7, respectively, according to the received instruction. The data input and output terminal 4 inputs and outputs the compressed data and information indicative of the compressed data to an external device (not shown).

The data input and output circuit 6 receives control from the instruction decoder 5 and the data size detection circuit 7, transfers input data from the data input and output terminal 6 to the memory cell array 2 through an internal data bus 8 upon data writing, and transfers compressed data output from the memory cell array 2 to the data input and output terminal 4 through the internal data bus 8 upon reading.

The memory cell array 2 performs writing and reading of data in a region designated by an address to and from the data input and output circuit 6 through the internal data bus 8, according to control of the instruction decoder 5.

The data size detection circuit 7 detects size of the compressed data respectively from a compression information added to the compression data output from the memory cell array 2 and indicative of size of data after compression upon reading, and from compression information added to the compressed data output from the data input and output circuit 6 and indicative of size of the compressed data upon writing, to operate the data input and output circuit 6 and the memory cell array 2 only for a period necessary for reading and writing of data, by controlling the data input and output circuit 6 and the instruction decoder 5 depending upon the detected size of data.

On the other hand, the data size detection circuit 7 can be realized by combining a counter, a register, a selector, a comparator and an AND circuit, for example. The data input and output circuit 6 can be realized by the input and output buffer circuit, for example.

Figure 2:
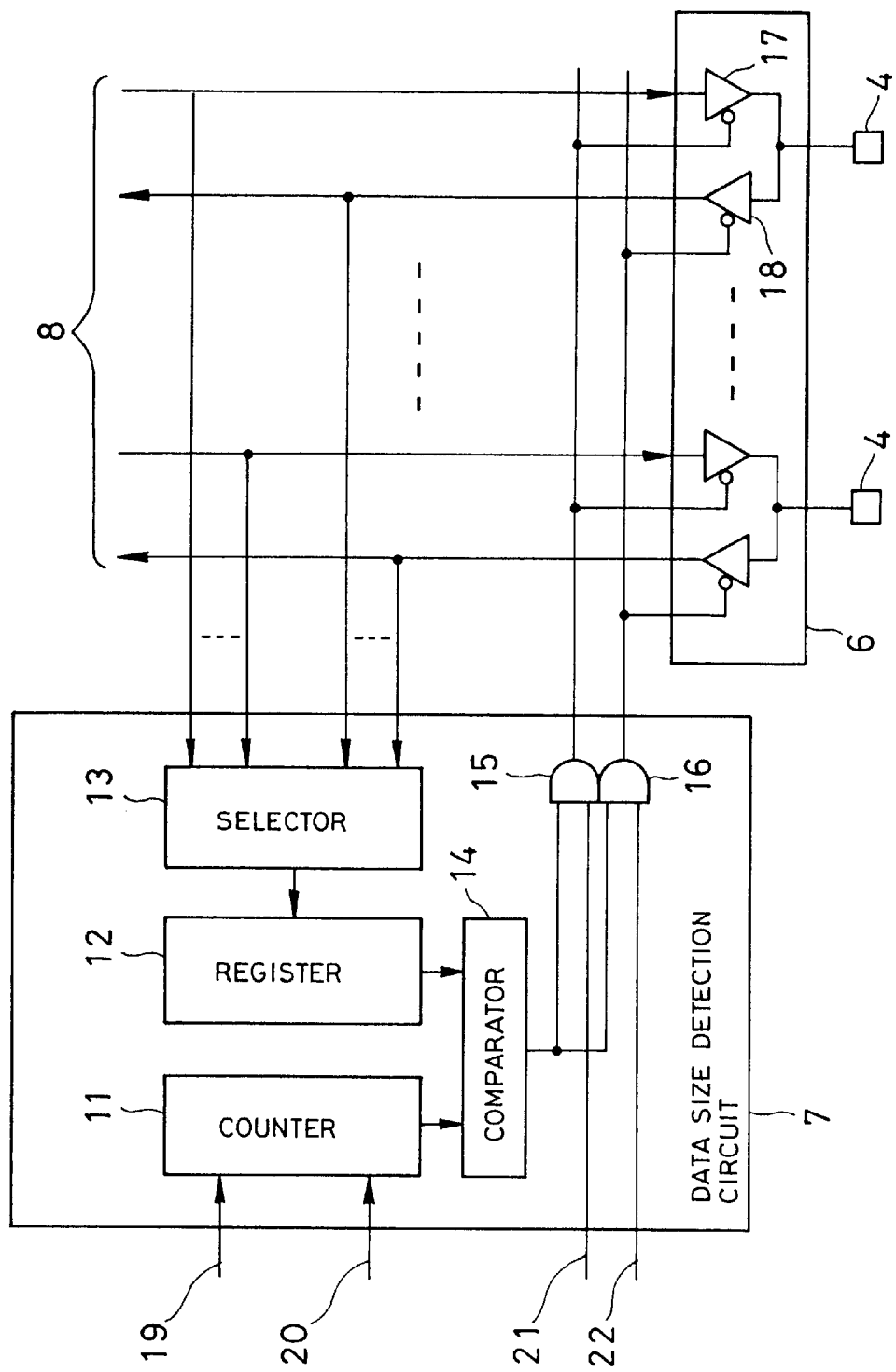
FIG. 2 is a block diagram showing a construction of a data size detection circuit and a data input and output circuit of FIG. 1.

FIG. 2 is a block diagram showing an example of construction of the data size detection circuit 7 and the data input and output circuit 6 of FIG. 1. In FIG. 2, the data size detection circuit 7 is constructed with a counter 11, a register 12, a selector 13, a comparator 14, an output AND circuit 15 and an input AND circuit 16. On the other hand, the data input and output circuit 6 is constructed with an output driver circuit 17 and an input driver circuit 18.

Here, a reset signal 19, a count-up signal 20, a data input signal 21 and a data output signal 22 input to the data size detection circuit 7 are output from the instruction decoder 5 according to an instruction input from respective instruction input terminal 3.

During reading or writing, the counter 11 holds information indicative of data amount of data which have already been transferred and is controlled by the reset signal 19 and the count-up signal 20. Upon initiation of reading or writing operation, the reset signal 19 uses a value held by the counter 11 for initialization. The count-up signal 20 updates a value held by the counter 11 at every occasion of processing of the read out data and the write-in data.

The selector 13 selects data output from the memory cell array 2 upon reading and selects data output from the data input and output circuit 6 upon writing, to output to the register 12. The register 12 holds compression information indicative of the size of the compression data, which compression information is contained in the compressed data received from the selector 13.

The comparator 14 compares the values held in the counter 11 and the register 12, outputs electrically LOW level when reading or writing of the compressed data is completed, and outputs HIGH level if not completed.

The data input signal 21 becomes HIGH level upon writing operation and becomes LOW level otherwise. The data output signal 22 becomes HIGH level upon reading operation and becomes LOW level otherwise. The output AND circuit 15 and the input AND circuit 16 output HIGH level when electrical levels of two inputs are HIGH level and output LOW level otherwise.

The output driver 17 becomes buffering state for outputting the input with electrical amplification when the input from the output AND circuit 15 becomes HIGH level (in this case, the compressed data from the memory cell array 2 is output to the data input and output terminal 4). When the input from the output AND circuit 15 is LOW level, the output side of the output driver circuit 17 is provided high resistance to shut off electrical influence (high impedance condition).

Similarly to the foregoing process, the input driver circuit 18 becomes buffering state when the input from the input AND circuit 16 is HIGH level (in this case, the compressed data from the data input and output terminal 4 is output to the memory cell array 2). On the other hand, when the input from the input AND circuit 16 is LOW level, the input driver circuit 18 becomes high impedance state.

Namely, after initiation of reading, the output driver circuit 17 becomes buffering state. When the comparator 14 detects completion of outputting of the compressed data, the output driver circuit 17 transit from the buffering state to the high impedance state. On the other hand, similarly to the above, after initiation of writing, the input driver circuit 18 becomes buffering state. When the comparator 14 detects completion of inputting of the compressed data, the input driver circuit 18 transit from the buffering state to the high impedance state.

Figure 3:
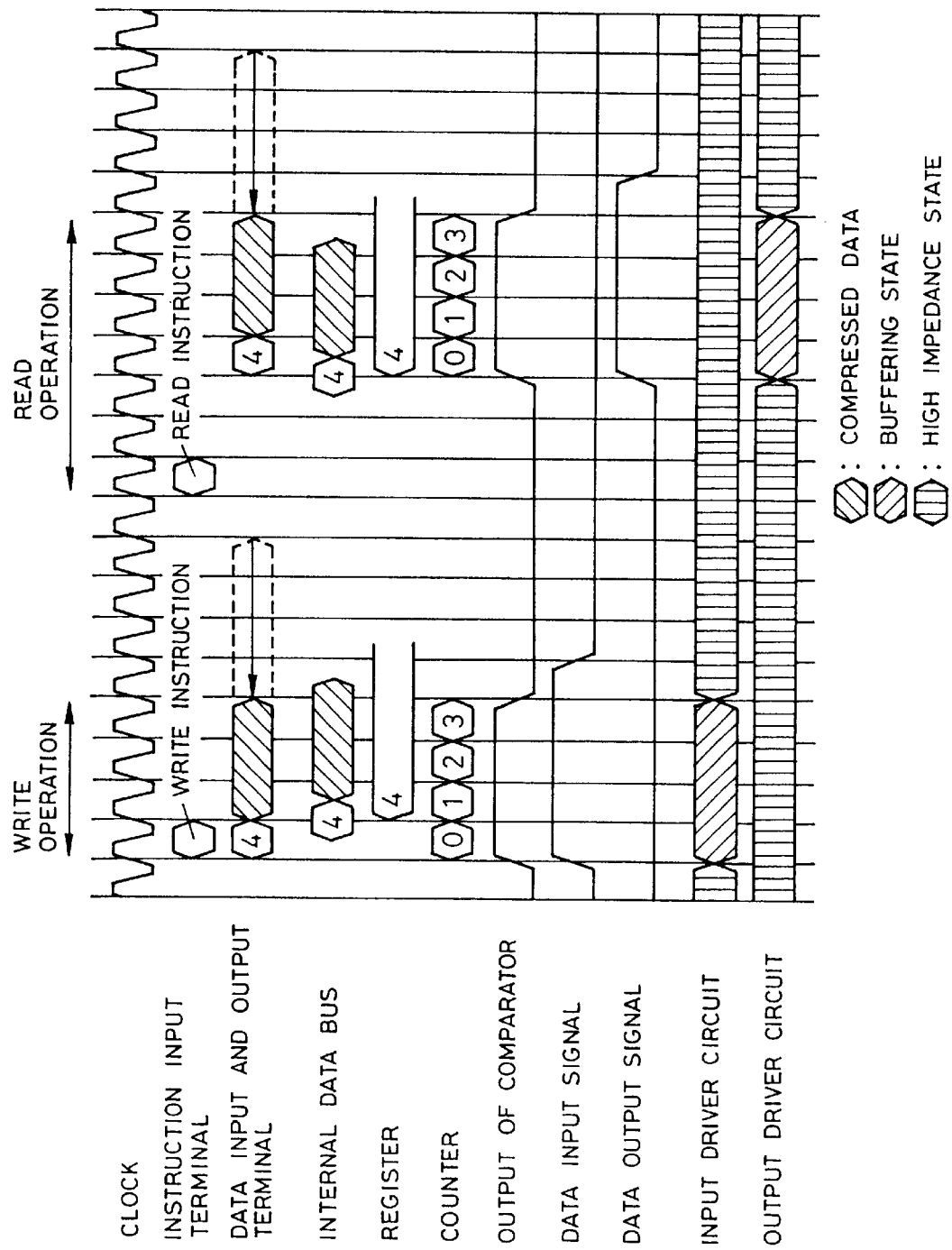
FIG. 3 is a timing chart showing a circuit operation of one embodiment of the memory LSI with the compressed data input and output function according to the present invention.

FIG. 3 is a timing chart showing circuit operation of one embodiment of the memory LSI according to the present invention. Circuit operation of one embodiment of the memory LSI according to the present invention will be discussed with reference to FIGS. 1 to 3. Here, for example, to the instruction input terminal 3 and the data input and output terminal 4, instruction and data transfer is performed in synchronism with a clock signal supplied from an external device. Writing and reading instruction is assumed to be transferred in respective one cycle and data is transferred at a rate of sixty-four bits per one cycle. Data before compression having a size of 64 bits×8 is read or written by one instruction (when data is transferred without compression, a period for eight cycles becomes necessary).

The size of the data after compression is generally different depending upon the image. However, for simplification of discussion, it is assumed that the data amount can be reduced to be 50% of the data amount before compression (accordingly, number of cycles required for transferring by compression becomes one half of number of transfer cycles before compression, i.e. four cycles). Here, as the compression information indicative of size of data after compression, number of cycles (4) required for inputting and outputting data to the data input and output terminal 4 is transferred at the earliest timing upon transfer of the compressed data. It is assumed that inputting of the compressed data to be written to the data input and output terminal 4 is initiated within a cycle where write instruction is input to the instruction input terminal 3 from the external device. It is also assumed that outputting of the compressed data to be read out is initiated to the data input and output terminal 4 after three cycles from inputting of the instruction read out from the external device to the instruction input terminal 3.

For data transfer between the internal data bus 8 and the data input and output terminal 4 to be performed through the data input and output circuit 8, a delay period about half cycle is assumed to be required. On the other hand, when writing and reading operation are not performed, the data input signal 22, the data output signal 21 and the output of the comparator 14 are LOW level, respectively.

When the memory LSI 1 receives write instruction of the compressed data from the external device through the instruction input terminal 3, the outputs of the data input signal 22 and the output of the comparator 12 become HIGH level under control of the instruction decoder circuit 5. The value of the counter 11 is initialized to be "zero" by the reset signal 19. By this, the input driver circuit 18 becomes buffering state to output the compressed data input from the data input and output terminal 4 to the internal data bus 8.

In the next cycle of the cycle, in which the write instruction is input, information of the size of the compressed data (4) in the input compressed data is held in the register 12. The counter 11 increments the held value by one per each cycle. The comparator 14 outputs LOW level at a timing where the value held in the comparator 14 and the value held in the register become consistent with each other. By this, upon completion of transfer of the compressed data, the input driver circuit 18 transit from the buffering state to the high impedance state.

Similarly to the foregoing process, when the memory LSI 1 receives the read instruction of the compressed data from the external device through the instruction input terminal 3, the data output signal 21 and the output of the comparator 14 become HIGH level under control of the instruction decoder circuit 5 after three cycles. Then, the value of the counter 11 is initialized to be "zero" by the reset signal 19. By this, the output driver circuit 17 becomes buffering state. Thus, the compressed data output from the memory cell array 2 is output to the data input and output terminal 4 via the internal data bus 8.

In the next cycle, information of the size of the compressed data (4) among the compressed data output from the memory cell array 2 is held in the register 12. The counter 11 increments the held value by one at every cycle. The comparator 14 outputs LOW level at a timing where the value held in the comparator 14 and the value held in the register 12 become consistent. By this, the output driver circuit 17 transit from the buffering state to the high impedance state at a timing where transfer of the compressed data is completed.

As set forth above, in one embodiment of the present invention, data is transferred in compressed form. Also, in one embodiment of the present invention, for the compressed data of variable length, size of the compressed data is recognized on the basis of the compression information contained in the compressed data for internal operation and operation of the data input and output circuit 6 for a period necessary for transferring the compressed data.

In this case, by simply transferring the compressed data, the size of the compressed data is not the actual size of the compressed data, it becomes necessary to perform the internal operation and operation of the data input and output circuit 6 adapting to the case where the compressed data becomes the largest. By this, when the data input and output circuit 6 issues subsequent instruction, effective data transfer can be performed without waiting force completion of extra operation of data transfer to make the effective passband width greater.

On the other hand, in one embodiment of the present invention, since expansion and modification for electrical specification of the input and output terminal is not required, the interface technology of the conventional semiconductor memory LSI can be used as is for the input and output interface.

Figure 4:
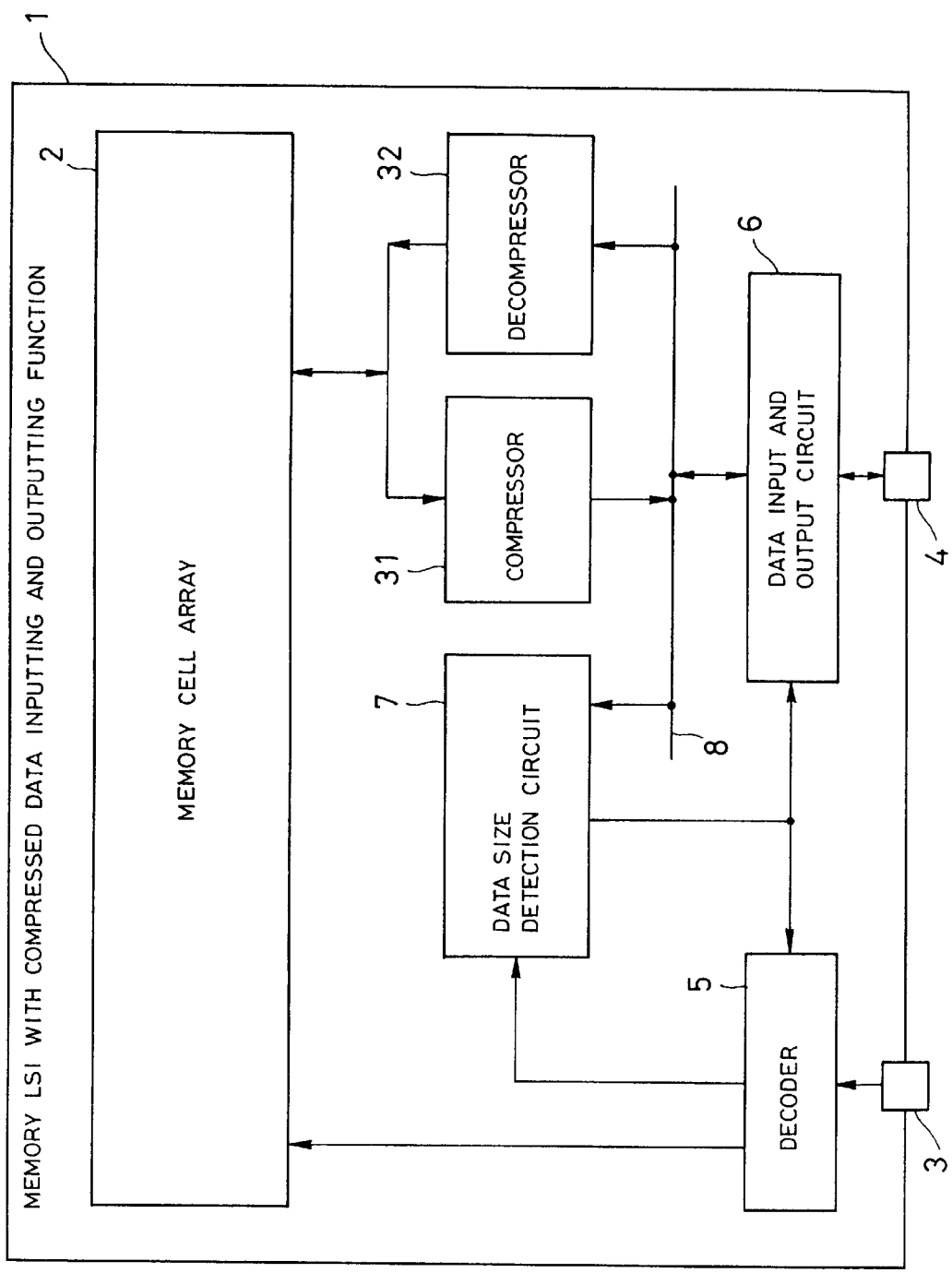
FIG. 4 is a block diagram showing another embodiment of the memory LSI with the compressed data input and output function according to the present invention.
Figure 5:
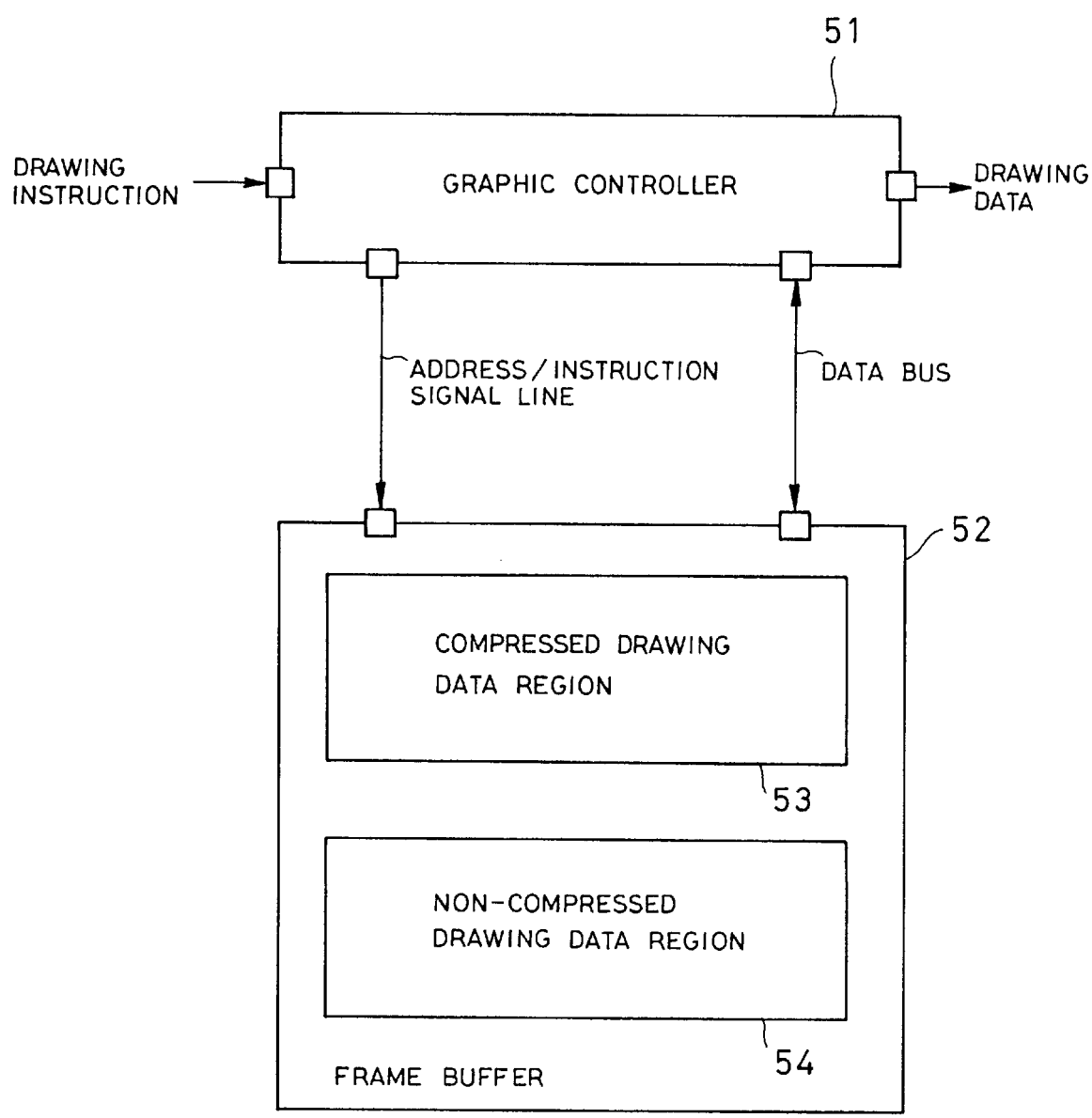
FIG. 5 is a block diagram showing a construction of a memory system employing a conventional data compression transfer.

FIG. 4 is a block diagram showing a construction of another embodiment of the memory LSI with the compressed data input and output function according to the present invention, In FIG. 4, the memory LSI 1 is constructed with the memory cell array 12, the instruction input terminal 3, the data input and output terminal 4, the instruction decoder 5, the data input and output circuit 6, the data size detection circuit 7, a data compressor 31 and a data decompressor 32.

From the instruction input terminal 3, information such as an instruction designating operation of reading out of data from the memory cell array 2, writing of data to the memory cell array 2 and so forth, an address designating storage position in the memory cell array 2 of data to be handled by the instruction, and so forth, is input.

The instruction decoder 5 receives an instruction and an address from the instruction input terminal 3 and controls the memory cell array 2, the data input and output circuit 6 and the data size detection circuit 7, the data compressor 31 and the data decompressor 32 respectively, according to the received instruction.

The data input and output terminal 4 inputs and outputs the compressed data and information indicative of the compressed data to an external device (not shown). The data input and output circuit 6 receives control from the instruction decoder 5 and the data size detection circuit 7, transfers the compressed data input from the data input and output terminal 4 to the data decompressor 32 and the data size detection circuit 7 upon data writing, and transfers compressed data output from the compressor 31 to the data input and output terminal 4 upon reading.

The data compressor 31 compresses data output from the memory cell array 2 and outputs to the data input and output circuit 6 and the data size detection circuit 7. The data decompressor 32 decompresses the compressed data input from the data input and output circuit 6 and outputs to the memory cell array 2. The memory cell array 2 performs writing of data from the decompressor 32 and reading of data to the compressor 31 with respect to the region designated by the address according to control of the instruction decoder 5.

The data size detection circuit 7 detects the size of the compressed data from the compression information added to the compressed data output from the compressor 31 upon reading and from the compressed information added to the compressed data output from the data input and output circuit 6 upon writing, to operate the data input and output circuit 6 and the memory cell array 2 for a period required for reading and writing of data by controlling the data input and output circuit 6 and the instruction decoder 5 according to the detected size.

Circuit operation of the shown embodiment of the memory LSI 1 according to the present invention will be discussed with reference to FIG. 4. Operation of the data input and output circuit 6 is similar to the circuit operation of one embodiment of the memory LSI 1 according to the present invention as illustrated in FIGS. 1 and 2. However, process of inputting and outputting data to the memory cell array 2 is different.

Namely, the compressed data output from the data input and output circuit 6 to the internal data bus 8 is input to the data decompressor 32 and the data size detection circuit 7.

The data size detection circuit 7 places the data input and output circuit 6 in buffering state for the period required for inputting the compressed data on the basis of the compression information indicative of the size of the compressed data input from the internal data bus 8. The compressed data input to the data decompressor 32 is decompressed into the original data and written in the memory cell array 2.

On the other hand, the original data held in the memory cell array 2 is compressed by the compressor 31 upon reading and output to the internal data bus 8 and the data size detection circuit 7. The data input and output detection circuit 7 places the data input and output circuit 6 in buffering state for the period required for transferring the compressed data on the basis of the compression information indicative of the size of the compressed data output from the compressor 31. The data input and output circuit 6 outputs the compressed data output to the internal data bus 8 to the data input and output terminal 4 under control of the data size detection circuit 7.

As set forth above, in the shown embodiment of the present invention, effective data transfer can be performed in the compressed form and the effective passband width can be made greater. On the other hand, since expansion and modification for electrical specification of the input and output terminal is not required, the interface technology for the conventional semiconductor memory LSI can be used as is for the input and output interface. Furthermore, when the compressed data can be stored as is, only data transfer may be performed for the unit of the size of the original data before compression.

However, in the shown embodiment of the present invention, since the original data is stored, start position or size of the original data in the memory cell array 2 can be varied arbitrarily. Therefore, transfer can be carried out with the start position and size adapting to the data necessary for the external device. Thus, effective passband width can be made greater.

By performing data transfer in compressed form, for the compressed data having variable length, the size of the compressed data is detected by the data size detection circuit 7 on the basis of the compression information contained in the compressed data to operate the memory cell array 2, the instruction decoder 5 and the data input and output circuit 6 for a period necessary for transferring the compressed data (necessary period for writing operation or necessary period for reading operation), to whereby expand effective passband width upon reading and writing of data from and to the memory LSI 1.

On the other hand, since the present invention can realize improvement or expansion of effective passband without requiring expansion and modification for the electrical specification of the input and output terminal and by logical expansion of data format, the interface technology of the conventional semiconductor memory LSI can be used for input and output interface.

Furthermore, by performing compression and decompression of data within the memory LSI 1 (compressor 31 and decompressor 32), by holding the original data before compression in the memory cell array, it becomes possible to perform reading and writing by varying start position and size of the original data in the memory cell array 2.

As set forth above, according to the present invention, in the memory LSI with the compressed data input and output function including the memory cell array performing writing and reading of data with the external devices, effective passband width can be expanded by detecting size of the compressed data on the basis of the compression information added to the compressed data and indicative of the size of data after compression, operating at least the internal circuit including the memory cell array and the input and output means for a period necessary for transferring the compressed data on the basis of the result of detection and whereby reducing the data transfer amount and thus by suppressing transfer loss in transfer of the variable length compressed data.

Although the present invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

What is claimed is:

1. A memory LSI (Large Scale Integrated circuit) with a compressed data input and output function including a memory cell array performing writing and reading of data with an external device, comprising:

input and output means for performing data transfer with the external device, the data transferred being in compressed form;

detecting means for detecting a size of said compressed data on the basis of a compression information added to said compressed data and indicative of a size of data after compression; and means for operating at least an internal circuit including said memory cell array and said input and output means for a period necessary for transferring said compressed data depending upon a result of size detection by said detecting means.

2. A memory LSI with a compressed data input and output function as set forth in claim 1, wherein said means for operating said internal circuit operates said internal circuit for a period necessary for a writing operation of data in said memory cell array depending upon the size of the compressed data from the external device detected by said detecting means for writing of data in said memory cell array, and operates said internal circuit for a period necessary for a reading operation of data from said memory cell array depending upon the size of said compressed data to be read out to the external device detected by said detecting means for reading of data from said memory cell array.

3. A memory LSI with a compressed data input and output function as set forth in claim 1, wherein writing and reading of said compressed data is performed in and from said memory cell array.

4. A memory LSI with a compressed data input and output function as set forth in claim 1, wherein writing and reading of an original data of said compressed data is performed in and from said memory cell array.

5. A memory LSI with a compressed data input and output function as set forth in claim 4, which further comprises decompressing means for decompressing the compressed data from said external device and compressing means for compressing data from said memory cell array.

6. A memory LSI with a compressed data input and output function as set forth in claim 5, wherein said detecting means detects the size of said compressed data on the basis of said compression information added for respective compressed data from said external device and compressed data by said compressing means.

7. A memory LSI with a compressed data input and output function as set forth in claim 5, wherein said compressing means adds the compression information indicative of the size after compression of data.

8. A memory LSI with a compressed data input and output function as set forth in claim 1, wherein said detecting means includes a selector for selecting a predetermined data from said compressed data and a register for holding said compression information included in said predetermined data received from said selector.

9. A memory LSI with a compressed data input and output function as set forth in claim 1, wherein said means for operating said internal circuit is constructed with a counter holding information indicative of a compressed amount which has been read or written, and a comparator for comparing information held by said counter and the size of the compressed data detected by said detecting means, for operating said internal circuit depending upon an output of said comparator.

10. A memory LSI with a compressed data input and output function as set forth in claim 1, wherein said input and output means comprises a driver circuit which selectively assumes a buffering state for outputting a data signal with electrical amplification and a high impedance state for electrically isolating and output.

11. A memory LSI with a compressed data input and output function as set forth in claim 10, wherein said driver circuit assumes the buffering state only for a period necessary for transfer of said compressed data.

* * * * *